(12) United States Patent
Ida et al.

(10) Patent No.: US 6,936,896 B2
(45) Date of Patent: Aug. 30, 2005

(54) SEMICONDUCTOR APPARATUS

(75) Inventors: Richard T. Ida, Chandler, AZ (US);
Hongzhong Xu, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/027,911

(22) Filed: Dec. 21, 2001

(65) Prior Publication Data

US 2003/0116778 A1 Jun. 26, 2003

(51) Int. Cl.[7] ............................................. H01L 23/62
(52) U.S. Cl. ...................... 257/361; 257/360; 257/173
(58) Field of Search .............................. 257/360, 361, 257/173

(56) References Cited

U.S. PATENT DOCUMENTS

| | | | | |
|---|---|---|---|---|
| 3,699,406 | A | * 10/1972 | Mapother et al. | ............ 257/162 |
| 3,904,931 | A | * 9/1975 | Leidich | ........................ 361/56 |
| 5,343,053 | A | * 8/1994 | Avery | .......................... 257/173 |
| 5,465,189 | A | 11/1995 | Polgreen et al. | |
| 5,682,047 | A | * 10/1997 | Consiglio et al. | ............ 257/335 |
| 5,872,379 | A | 2/1999 | Lee | |
| 6,002,568 | A | 12/1999 | Ker et al. | |
| 6,242,763 | B1 | 6/2001 | Chen et al. | |
| 6,268,639 | B1 | * 7/2001 | Li et al. | ....................... 257/577 |
| 6,462,380 | B1 | * 10/2002 | Duvvury et al. | ............ 257/355 |

OTHER PUBLICATIONS

Umesh Sharma et al, "An ESD Protection Scheme for Deep Sub–micron ULSI Circuits," 1995 Symposium on VLSI Technology Digest of Technical Papers, pp. 85–86.

* cited by examiner

*Primary Examiner*—Jerome Jackson
(74) *Attorney, Agent, or Firm*—Toler, Larson & Abel, LLP

(57) ABSTRACT

A low voltage thyristor is disclosed that can be used to provide protection during electrostatic discharge event. The thyristor is connected between voltage reference nodes having a common potential, such as ground nodes, that are isolated from one another during normal operating conditions. During an ESD event on one of the voltage reference nodes, the low voltage thyrister triggers, at a voltage of less than ten volts, to help discharge the ESD current through the otherwise isolated ground node.

59 Claims, 3 Drawing Sheets

SEMICONDUCTOR APPARATUS

FIELD OF THE DISCLOSURE

The present disclosure relates generally to semiconductor devices, and more particularly to thyristor devices and applications.

BACKGROUND

It is well known in the electronic arts that electrostatic discharge (ESD) can damage and/or destroy semiconductor devices. Protection circuitry is generally designed into semiconductor devices to reduce the risk of damage due to ESD. For example, thyristors are often used to reduce damage that can occur as a result of an ESD event on an input-output (I/O) of a semiconductor device. A circuit representation of a thyristor used as an I/O protection circuit is illustrated in FIG. 1.

The thyristor of FIG. 1 includes an anode node that is shorted through an n-type well tie (nwt) to the nwell, and a cathode node that is shorted through a p-type well tie (pwt) to the p-well. The thyristor of FIG. 1 is illustrated in cross-sectional view in FIG. 2, where the psd, and nsd notation indicate regions that can be formed using p-type and n-type source-drain formation processes respectively. Likewise, the n-well and p-well notations indicator regions that can be formed using well formation processes, while the pgc region is a doped region known to be used in various processes including Bipolar-Complimentary Oxide Semiconductor (BiCMOS) processes. The thyristor of FIG. 2 requires a voltage and trigger current large enough to protect against latch-up of the thyrister during normal operation, while still maintaining a trigger voltage sufficiently low to activate and clamp during an ESD event. However, the trigger voltage of the prior art thyrister of FIGS. 1 and 2 can result in too large a voltage drop when used in voltage sensitive applications, such as for providing ESD protection between in ground nodes.

Another technique to protect against ESD damage of semiconductor devices is to connect otherwise isolated ground references to each other using opposing p-n junction diodes in parallel. While this allows for ESD current to flow from one ground reference node to another, it does so at the cost of introducing the diode junction capacitance between the two ground references, resulting in a reduced signal isolation between the grounds. The conventional thyristor of FIG. 1 if used to provide ESD protection between isolated ground nodes causes reduced signal isolation due to a relatively large associated capacitance of approximately 300 femptofarads, and has a trigger voltage which has been found to be too large to be an effective protection circuit against damage caused by ESD events. It should be apparent from the above discussion that a thyristor device capable of providing high conductance protection during ESD events and a high degree of signal isolation along with a low capacitance during normal operation would be useful.

BRIEF DESCRIPTION OF THE DRAWINGS

Various objects, advantages, features and characteristics of the present disclosure, as well as methods, operation and functions of related elements of structure, and the combination of parts and economies of manufacture, will become apparent upon consideration of the following description and claims with reference to the accompanying drawings, all of which form a part of this specification.

DETAILED DESCRIPTION OF THE FIGURES

The present disclosure describes a low voltage thyristor and specific application embodiments implementing such a low voltage thyristor. The low voltage thyristor has a low voltage trigger to activate the thyristor at a voltage of approximately ten volts or less. This low voltage trigger allows for compensation of ESD (electrostatic discharge) events based on a human body model. Such a thyristor can be used to provide ESD protection between isolated voltage references, such as ground nodes, of data processing devices. Note that the term isolated voltage references indicates that in normal operation the voltage reference nodes are adapted to be isolated from each other, such that signal isolation is maintained between the voltage references. For example, isolated voltage references function such that normal operating noise on a first voltage reference node does not have a functional effect on devices connected to the second voltage reference node. FIGS. 3–12 illustrate specific embodiments in accordance with the present invention.

Figure 1:
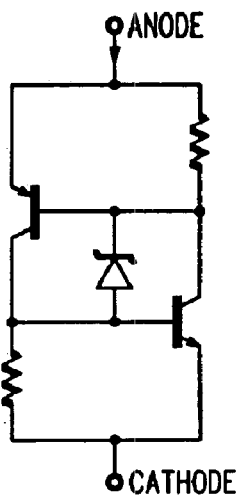
FIG. 1 illustrates a prior art thryristor circuit representation.
Figure 2:
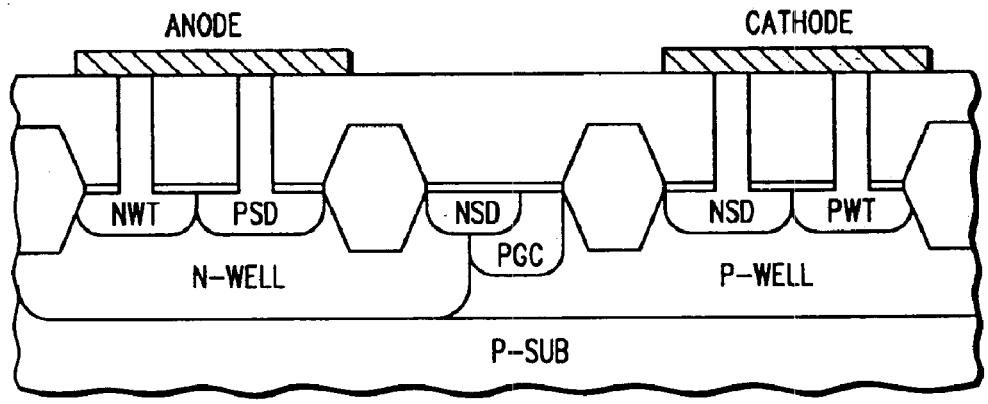
FIG. 2 illustrates a cross-sectional view of an implementation of the circuit of FIG. 1.
Figure 3:
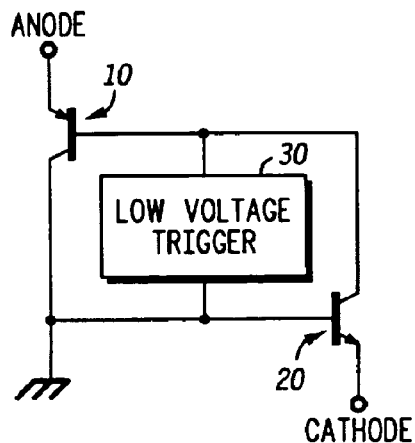
FIG. 3 illustrates in partial block diagram and partial circuit form a thyristor circuit representation in accordance with one embodiment of the present invention.

FIG. 3 illustrates a circuit representing a thyristor having a low voltage trigger 30. The low voltage trigger 30 is connected to the base of the PNP transistor 10 and to the base of the NPN transistor 20. In operation, the low voltage trigger 30 activates the thyristor by drawing current from the base of the PNP transistor while simultaneously providing current to the base of the NPN transistor, thereby activating the thyristor by turning on both transistor 10 and transistor 20. A specific implementation of a low voltage trigger 30 is illustrated in FIG. 4.

Figure 4:
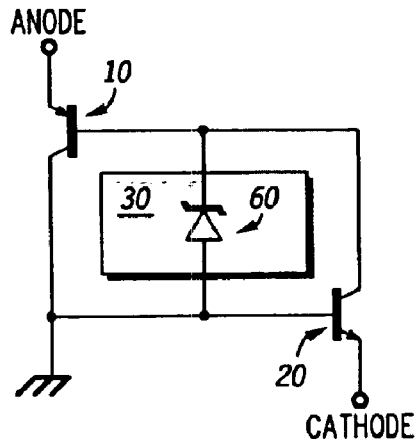
FIG. 4 illustrates in circuit form a thyristor circuit representation having a zener diode in accordance with one embodiment of the present invention.
Figure 5:
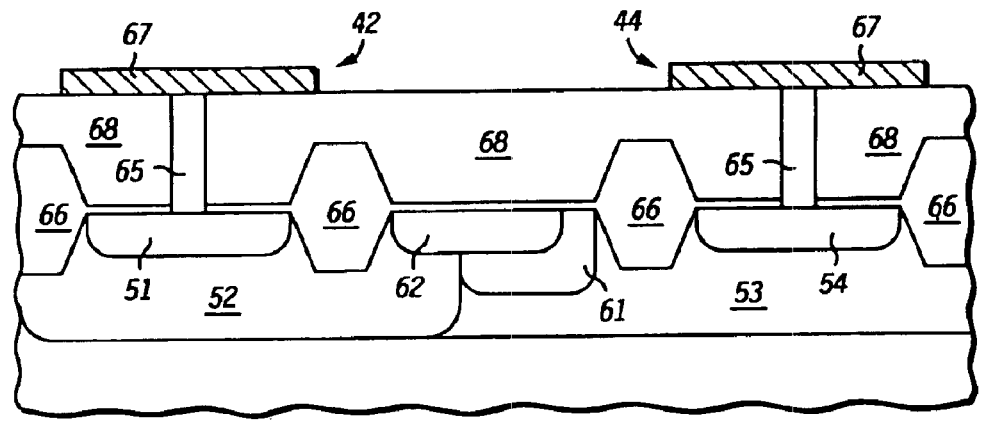
FIG. 5 illustrates a cross-sectional view of an implementation of the circuit of FIG. 4.

FIG. 4 is analogous to FIG. 3 with a zener diode implementing the low voltage trigger 30. FIG. 5 further illustrates a cross-sectional view of the thyristor of FIG. 4. In the embodiment illustrated in FIG. 5, an anode connector 42 and a cathode connector 44 provide access to the thyristor structure which includes p-type region 51, n-type region 52, p-type region 53, and n-type region 54. Specifically, the anode connector 42 is connected to the p-type region 51, and the cathode connector 44 is connected to the n-type region 54. The various n-type and p-type regions represent regions of varying conductivity types (i.e. a p-conductivity type and an n-conductivity type). The boundary between immediately adjacent conductivity type regions are referred to as conductivity type junctions. For example, the p-n junction formed at the boundary between p-type region 51 and n-type region 52 is a conductivity type junction. Conductivity type junctions are formed in a similar manner between regions 52–53 and 53–54. It will be appreciated that the PNP transistor 10 of FIG. 3 is formed by the conductivity type junctions between regions 51–52 and regions 52–53. Likewise, NPN transistor 20 of FIG. 3 is formed by the conductivity type junctions between regions 52–53 and 53–54. The regions 61 and 62 of FIG. 5 implement the zener diode 60 of FIG. 4, as discussed in greater detail below.

During operation, the zener diode 60 will break down at a low voltage (i.e. the beginning of an ESD event) to allow current to flow from PNP 10 and provide current to the base of the NPN device 20. In one embodiment, the zener 60 is chosen to have a breakdown voltage of 10 volts or less, or approximately 10 volts or less. In another embodiment, the zener diode 60 is chosen to have a breakdown voltage of 6 volts or less, or approximately 6 volts or less. The term approximately is used to account for variations of various processing and operating variables that can prevent a precise parametric value, such as zener breakdown voltage, from being specified. For example, variations in processing are known to result in variations of parametric values, likewise operating temperatures can result in variations of specific parametric values, such as the breakdown voltage of a zener diode. Because such variations are not entirely predictable the term approximately is used to qualify an expected value.

Referring again to FIG. 5, the zener diode is implemented by forming a p-type region 61 at least partially overlying region 53, and n-type region 62 overlying the p-type region 61 and the n-type region 52, such that the regions 61 and 62 at least partially overlie region 53. Note that region 61 FIG. 5 can also overlie a portion of region 52, even though it is not shown. It will be appreciated that the formation of the regions 61 and 62 to form zener diode 60 are know in the art. For example, the p-type region 61 can be formed using a channel implant processes such as those used with various BiCMOS processes. Likewise, the regions 51 and 54 can be formed using known p-type & n-type source-drain formation processes, respectively, while regions 52 and 53 can be formed using known n-type and p-type well formation processes, respectively. The anode nodes or connectors 42 & 44 include conductive traces 67 and conductive vias 65 formed within the interlevel dielectric layer 68.

Figure 6:
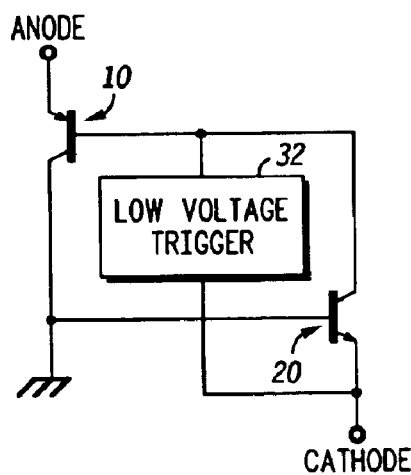
FIG. 6 illustrates in partial block diagram and partial circuit form a thyristor circuit representation in accordance with one embodiment of the present invention.
Figure 7:
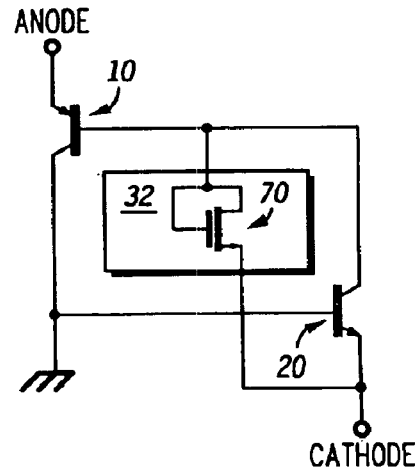
FIG. 7 illustrates in circuit form a thyristor circuit representation having a field effect transistor in accordance with one embodiment of the present invention.

FIG. 6 illustrates a circuit representing a thyristor having a low voltage trigger portion 32 coupled between the collector and the emitter of the NPN transistor 20. FIG. 7 illustrates a more specific circuit representing the thyristor of FIG. 6. Specifically, FIG. 7 illustrates an n-an n-channel field effect transistor (FET) 70 having its drain and gate commonly connected to the collector of the NPN transistor 20 and to the base PNP transistor 10. The source of the FET 70 is connected to the emitter of transistor 20. In this configuration, an ESD event on the anode will cause the FET transistor 70 to turn on, providing electrons to the base of the PNP transistor 10, resulting in the overall activation of the thyristor. A specific implementation of the device of FIG. 7 is illustrated in FIG. 8.

Figure 8:
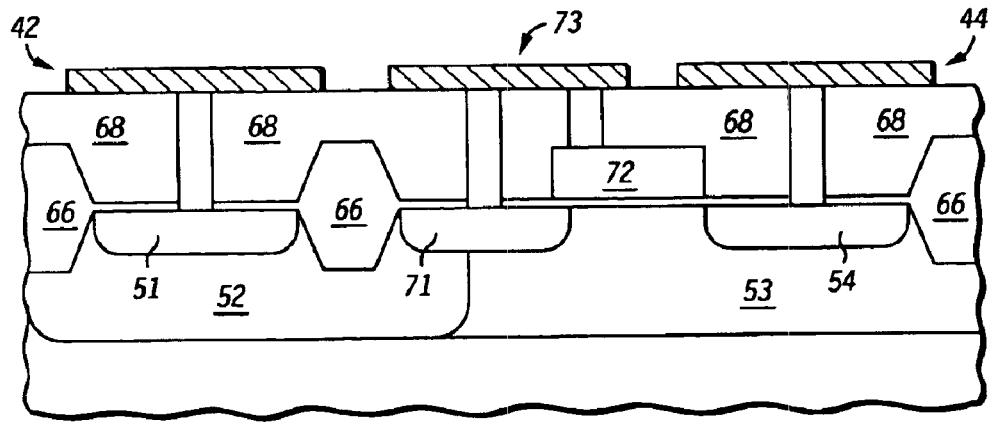
FIG. 8 illustrates a cross-sectional view of an implementation of the circuit of FIG. 7.

FIG. 8 illustrates a cross sectional view of a thyristor structure similar to the thyristor structure illustrated in FIG. 5. Analogous features between FIG. 8 and FIG. 5 are similarly numbered. The FET 70 is represented in FIG. 8 by n-type region 71 (drain current node), gate structure, n-type region 54 (source current node), and conductive portion 73. Note conductive portion 73 is illustrated to include vias and a metal trace, to connect the gate structure 72 to n-type region 71. The n-type region 71 is electrically coupled to n-type region 52 so that an ESD event on the anode causing current to flow into the region 52 will result in the gate 72 voltage to rise creating an n-channel in the underlying substrate, thus resulting in current to flow from the base of the p-type transistor (region 52) causing the thyristor to turn on.

Figure 9:
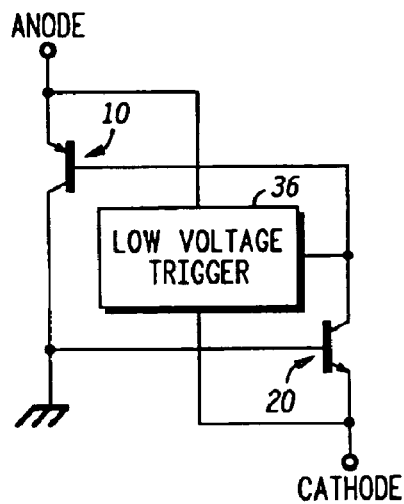
FIG. 9 illustrates in partial block diagram and partial circuit form a thyristor circuit representation in accordance with another embodiment of the present invention.
Figure 10:
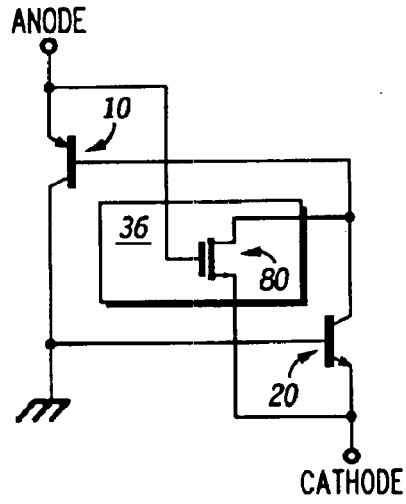
FIG. 10 illustrates in circuit form a thyristor circuit representation having a field effect transistor in accordance with another embodiment of the present invention.

FIG. 9 illustrates a thyristor having a low voltage trigger connected to the collector of transistor 20, the emitter of transistor 20, and to the anode. FIG. 10 illustrates a specific implementation the thyristor of FIG. 9. Specifically, FIG. 10 illustrates a circuit representing a thyristor using a FET 80 in a manner similar to that described with reference to FIGS. 7 & 8. However, the gate of the FET 80 of FIG. 10 is connected to the anode instead of its own drain. The thyristor implementation of FIG. 10 can be used in a specific embodiment when the anode and cathode are connected to common reference nodes, whereby an ESD event will result in the FET 80 turning on to drawn current from the base of PNP transistor 20, thereby triggering the thyristor.

One advantage of the devices described with reference to FIGS. 8 and 10 is that they can be readily implemented using CMOS (complimentary metal oxide semiconductor) processes, as opposed to more costly processes, such as BiCMOS processes.

Figure 11:
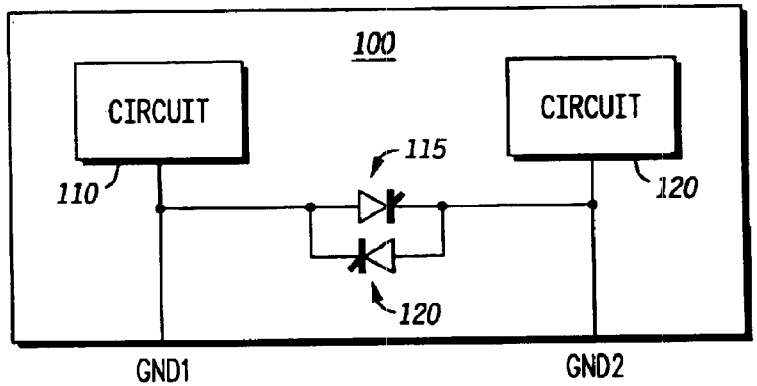
FIG. 11 illustrates a device using a thyristor to provide ESD protection to isolated voltage references.

FIG. 11 illustrates a device 100 having a plurality of circuit portions, including circuits 110 and 120. The device 100 will generally be an integrated data processing device, such as a microprocessor, microcontroller, or other system on a chip applications. Circuits 110 and 120 are respectively connected to ground nodes GND1 and GND2, which are connected to each other internally by an ESD protection circuit that includes thyristors 115 and 120 of the type described herein. Generally, one of circuit 110 and 120 will be more sensitive to noise on a voltage reference node, such as a ground node, that the other circuit. Examples of specific circuits that can be sensitive to noise include analog circuits, including radio frequency analog circuits. Therefore, isolation techniques are often used to accommodate the need for a low noise reference source by sensitive circuitry. However, in the event of an ESD event on one of the reference sources, it is desirable to allow for a current path to the other reference source to help dissipate any potentially damaging current from such an event. By using low voltage thyristors 110 and 120, which are of the type described herein, a low capacitance connection, that provides high conductivity at a low trigger voltage is realized.

Figure 12:
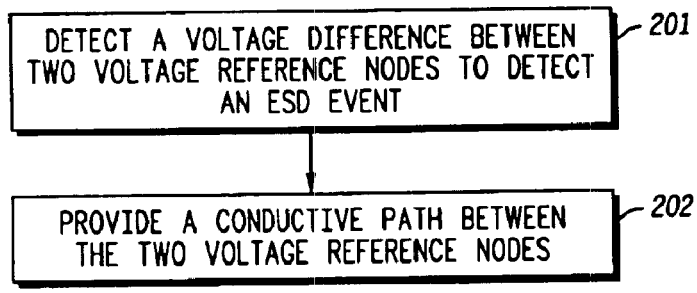
FIG. 12 illustrates a flow diagram of a method in accordance with a specific embodiment of the present disclosure.

FIG. 12 illustrates a flow diagram of a method in accordance with the present invention. At step 201, a voltage difference is detected between two voltage reference nodes in order to detect an ESD event. The voltage reference nodes will generally be at the same voltage potential during normal operation. However, it would be anticipated that voltage reference nodes can be at different potentials during normal operation, provided step 201 takes into account the normal voltage difference.

At step 202, a conductive path is provided between the two voltage reference nodes in order to shunt the ESD event current from one voltage reference node to the other, thereby providing protection against an ESD event.

In the preceding detailed description of the figures, reference has been made to the accompanying drawings which form a part thereof, and in which is shown by way of illustration specific embodiments in which the invention may be practiced. These embodiments are described in sufficient detail to enable those skilled in the art to practice the invention, and it is to be understood that other embodiments may be utilized and that logical, mechanical, and/or electrical changes may be made without departing from the spirit or scope of the invention. For example, while the specific examples have been illustrated as protecting against ESD events that may occur on one of a plurality of ground nodes, it will be appreciated that the techniques described apply equally as well to reference nodes having a common voltage. In addition, it will be appreciated that many other varied embodiments that incorporate the teachings of the invention may be easily constructed by those skilled in the art. Accordingly, the present disclosure is not intended to be limited to the specific form set forth herein, but on the contrary, it is intended to cover such alternatives, modifications, and equivalents, as can be reasonably included within the spirit and scope of the invention. The preceding detailed description is, therefore, not to be taken in a limiting sense, and the scope of the present disclosure is defined only by the appended claims.

What is claimed is:

1. An integrated data processing device comprising:
   a first circuit coupled to a first voltage reference node;
   a second circuit coupled to a second voltage reference node;
   an electrostatic discharge protection device operable to provide a current path between the first voltage reference node and the second voltage reference node during an electrostatic event, the electrostatic discharge protection device comprising
      a first conductivity type junction formed between a first region of a first conductivity type and a second region of a second conductivity type;
      a second conductivity type junction formed between the second region and a third region of the first conductivity type;
      a third conductivity type junction formed between the third region and a fourth region of the second conductivity type, the fourth region coupled to the second voltage reference node; and
      an anode node coupled to the first voltage reference node and connected to one or more regions of the electrostatic discharge protection device including the first region, wherein all regions of the discharge protection device connected to the anode node are of a common conductivity type; and
      a low voltage trigger control portion coupled to the second region and the third region to provide a electrostatic discharge protection device triggering current at a voltage of less than 10 volts.

2. An apparatus comprising:
   a first circuit coupled to a first voltage reference node;
   a second circuit coupled to a second voltage reference node;
   an electrostatic discharge protection device operable to provide a current path and a capacitance of less than 120 Femtofarads between the first voltage reference node and the second voltage reference node during an electrostatic event, the electrostatic discharge protection device comprising
      a thyristor coupled between the first voltage reference node and the second voltage reference node to provide the current path.

3. The apparatus of claim 2 wherein the first circuit is an analog circuit and the second circuit is a digital circuit.

4. The apparatus of claim 2 wherein the first circuit is a radio frequency analog circuit.

5. The apparatus of claim 4 wherein the second circuit is a digital circuit.

6. The apparatus of claim 4 wherein the second circuit is an analog circuit.

7. A method comprising:
   providing a voltage reference to a first circuit of an integrated circuit device using a first voltage reference node during normal operation;
   providing the voltage reference to a second circuit of the integrated circuit device using a second voltage reference node during normal operation, the second voltage reference node and the first voltage reference node being different nodes;
   detecting a voltage difference between the first voltage reference node and the second voltage reference node of less than approximately 10 volts to determine when an electrostatic discharge event is occurring; and
   providing a conductive path through a thyristor having a capacitance of less than 120 Femtofarads from anode to cathode when the voltage difference is detected.

8. The method of claim 7, wherein the voltage difference is less than 10 volts.

9. An apparatus comprising:
   a thyristor comprising
      a plurality conductivity type junctions comprising
         a first conductivity type junction formed between a first region of a first conductivity type and a second region of a second conductivity type;
         a second conductivity type junction formed between the second region and a third region of the first conductivity type;
         a third conductivity type junction formed between the third region and a fourth region of the second conductivity type;
      a voltage trigger control coupled to the second region and the third region to provide a thyristor triggering current at a voltage of less than 10 volts;
      an anode connected to the plurality of conductivity type junctions only at the first region;
      a cathode coupled to the fourth region;
   a first voltage reference node coupled to a first circuit and the anode; and
   a second voltage reference node coupled to a second circuit and the cathode, wherein the thyristor is operable to provide a current path between the first voltage reference node and the second voltage reference node during an electrostatic event.

10. The apparatus of claim 9 wherein the second region is a well region of the second conductivity type.

11. The apparatus of claim 10 wherein the third region is a well region of the first conductivity type.

12. The apparatus of claim 11, wherein the cathode is connected to the plurality of conductivity type junctions only at the fourth region.

13. The apparatus of claim 9, wherein the cathode is connected to the plurality of conductivity type junctions only at the fourth region.

14. The apparatus of claim 9, wherein the first voltage reference node and the second reference node are to provide a common voltage reference.

15. The apparatus of claim 9, wherein the voltage trigger control is a zener diode.

16. The apparatus of claim 9, wherein the voltage trigger control is a field effect transistor.

17. The apparatus of claim 9, wherein the first voltage reference node and the second voltage reference node are ground nodes.

18. The device of claim 17, wherein the electrostatic discharge protection device further comprises:
    a cathode node coupled to the second voltage reference node and connected to one or more regions of the electrostatic discharge protection device including the fourth region, wherein all regions of the electrostatic discharge protection device connected to the anode node are of a common conductivity type.

19. The apparatus of claim 1 wherein the first circuit is an analog circuit and the second circuit is a digital circuit.

20. The apparatus of claim 1 the second circuit is a digital circuit.

21. The apparatus of claim 1 wherein the first circuit is a radio frequency analog circuit.

22. The apparatus of claim 21 wherein the second circuit is an analog circuit.

23. The apparatus of claim 1, wherein the low voltage trigger control portion is a zener diode.

24. The apparatus of claim 1, wherein the low voltage trigger control portion is a field effect transistor.

25. An integrated data processing device comprising:
    a first circuit coupled to a first voltage reference node;
    a second circuit coupled to a second voltage reference node;
    an electrostatic discharge protection device operable to provide a current path and a capacitance of less than 120 Femtofarads between the first voltage reference node and the second voltage reference node during an electrostatic event, the electrostatic discharge protection device comprising
        a first conductivity type junction formed between a first region of a first conductivity type and a second region of a second conductivity type;
        a second conductivity type junction formed between the second region and a third region of the first conductivity type;
        a third conductivity type junction formed between the third region and a fourth region of the second conductivity type, the fourth region coupled to the second voltage reference node; and
        an anode node coupled to the first voltage reference node and connected to one or more regions of the electrostatic discharge protection device including the first region, wherein all regions of the discharge protection device connected to the anode node are of a common conductivity type.

26. The apparatus of claim 25 wherein the first circuit is an analog circuit and the second circuit is a digital circuit.

27. The apparatus of claim 25 wherein the second circuit is a digital circuit.

28. The apparatus of claim 26 wherein the first circuit is a radio frequency analog circuit.

29. The apparatus of claim 25 wherein the second circuit is an analog circuit.

30. An apparatus comprising:
    a first circuit coupled to a first voltage reference node;
    a second circuit coupled to a second voltage reference node;
    an electrostatic discharge protection device operable to provide a current path between the first voltage reference node and the second voltage reference node during an electrostatic event, the electrostatic discharge protection device comprising
        a thyristor coupled between the first voltage reference node and the second voltage reference node to provide the current path, the thyristor comprising a voltage trigger control portion coupled to provide a thyristor triggering current at a voltage of less than 10 volts.

31. The apparatus of claim 30 wherein the first circuit is an analog circuit and the second circuit is a digital circuit.

32. The apparatus of claim 30 wherein the second circuit is a digital circuit.

33. The apparatus of claim 30 wherein the first circuit is a radio frequency analog circuit.

34. The apparatus of claim 33 wherein the second circuit is an analog circuit.

35. The apparatus of claim 30, wherein the voltage trigger control portion is a zener diode.

36. The apparatus of claim 30, wherein the voltage trigger control portion is a field effect transistor.

37. The apparatus of claim 7 wherein the first circuit is an analog circuit and the second circuit is a digital circuit.

38. The apparatus of claim 7 wherein the second circuit is a digital circuit.

39. The apparatus of claim 7 wherein the first circuit is a radio frequency analog circuit.

40. The apparatus of claim 39 wherein the second circuit is an analog circuit.

41. The apparatus of claim 9 wherein the first circuit is an analog circuit and the second circuit is a digital circuit.

42. The apparatus of claim 9 wherein the second circuit is a digital circuit.

43. The apparatus of claim 9 wherein the first circuit is a radio frequency analog circuit.

44. The apparatus of claim 43 wherein the second circuit is an analog circuit.

45. The apparatus of claim 9, wherein the voltage trigger control is a zener diode.

46. The apparatus of claim 9, wherein the voltage trigger control is a field effect transistor.

47. An apparatus comprising:
    a thyristor operable to provide a current path from a first region to a fourth region having
        a capacitance of less than 120 Femtofarads comprising
        a plurality conductivity type junctions comprising
            a first conductivity type junction formed between the first region of a first conductivity type and a second region of a second conductivity type;
            a second conductivity type junction formed between the second region and a third region of the first conductivity type;
            a third conductivity type junction formed between the third region and the fourth region of the second conductivity type;
        an anode connected to the plurality of conductivity type junctions only at the first region;
        a cathode coupled to the fourth region;
    a first voltage reference node coupled to a first circuit and the anode; and a second voltage reference node coupled to a second circuit and the cathode, wherein the thyristor is operable to provide a current path between the first voltage reference node and the second voltage reference node during an electrostatic event.

48. The apparatus of claim 47 wherein the second region is a well region of the second conductivity type.

49. The apparatus of claim 48 wherein the third region is a well region of the first conductivity type.

50. The apparatus of claim 49, wherein the cathode is connected to the plurality of conductivity type junctions only at the fourth region.

51. The apparatus of claim 47, wherein the cathode is connected to the plurality of conductivity type junctions only at the fourth region.

52. The apparatus of claim 47, wherein the first voltage reference node and the second reference node are to provide a common voltage reference.

53. The apparatus of claim 47 further comprising:

a voltage trigger control coupled to the second region and the third region to provide a thyristor triggering current.

54. The apparatus of claim 53, wherein the voltage trigger control is a zener diode.

55. The apparatus of claim 53, wherein the voltage trigger control is a field effect transistor.

56. The apparatus of claim 47 wherein the first circuit is an analog circuit and the second circuit is a digital circuit.

57. The apparatus of claim 47 wherein the second circuit is a digital circuit.

58. The apparatus of claim 47 wherein the first circuit is a radio frequency analog circuit.

59. The apparatus of claim 58 wherein the second circuit is an analog circuit.

* * * * *

UNITED STATES PATENT AND TRADEMARK OFFICE
CERTIFICATE OF CORRECTION

PATENT NO. : 6,936,896 B2  
DATED : August 30, 2005  
INVENTOR(S) : Richard T. Ida et al.

It is certified that error appears in the above-identified patent and that said Letters Patent is hereby corrected as shown below:

<u>Column 7,</u>
Line 9, change Claim "9" to Claim -- 1 --.
Line 22, add -- wherein -- after "Claim 1".

Signed and Sealed this

Twenty-ninth Day of November, 2005

JON W. DUDAS
*Director of the United States Patent and Trademark Office*